(12) United States Patent
Muraki

(10) Patent No.: US 11,328,932 B2
(45) Date of Patent: May 10, 2022

(54) SUBSTRATE PROCESSING METHOD AND SUBSTRATE PROCESSING APPARATUS

(71) Applicant: TOKYO ELECTRON LIMITED, Tokyo (JP)

(72) Inventor: Yusuke Muraki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/194,808

(22) Filed: Mar. 8, 2021

(65) Prior Publication Data
US 2021/0287906 A1    Sep. 16, 2021

(30) Foreign Application Priority Data

Mar. 10, 2020   (JP) .............................. JP2020-041347

(51) Int. Cl.
*H01L 21/3065* (2006.01)
*H01J 37/32* (2006.01)
*H01J 37/305* (2006.01)
*H01L 21/67* (2006.01)
*H01L 21/02* (2006.01)

(52) U.S. Cl.
CPC ...... *H01L 21/3065* (2013.01); *H01J 37/3053* (2013.01); *H01J 37/32449* (2013.01); *H01L 21/02126* (2013.01); *H01L 21/67069* (2013.01)

(58) Field of Classification Search
None
See application file for complete search history.

(56) References Cited

U.S. PATENT DOCUMENTS

2018/0248021 A1* 8/2018 Bi ....................... H01L 29/0653

FOREIGN PATENT DOCUMENTS

WO    2012/063901 A1    5/2012

* cited by examiner

*Primary Examiner* — Roberts P Culbert
(74) *Attorney, Agent, or Firm* — Nath, Goldberg & Meyer; Jerald L. Meyer; Tanya E. Harkins

(57) ABSTRACT

A method for processing a substrate on which silicon layers and silicon germanium layers are alternately disposed, includes: forming an oxide layer on a surface layer of a spacer layer based on an oxygen-containing gas radicalized using remote plasma, wherein the spacer layer having a low dielectric constant is formed at least on side surfaces of the silicon layers and the silicon germanium layers; and removing the formed oxide layer by etching.

10 Claims, 10 Drawing Sheets

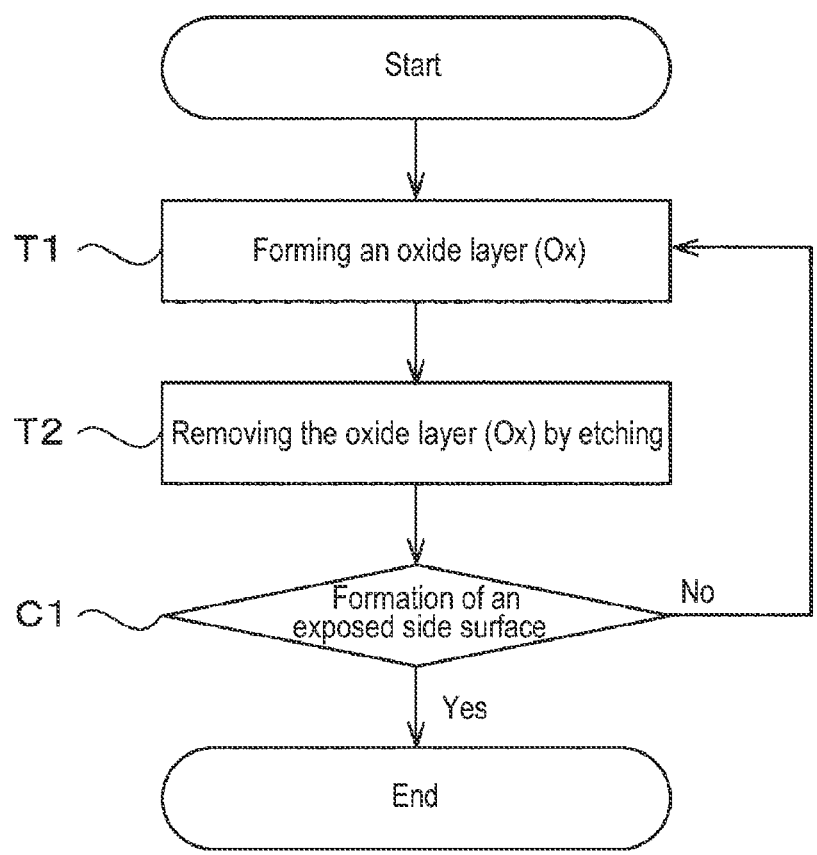

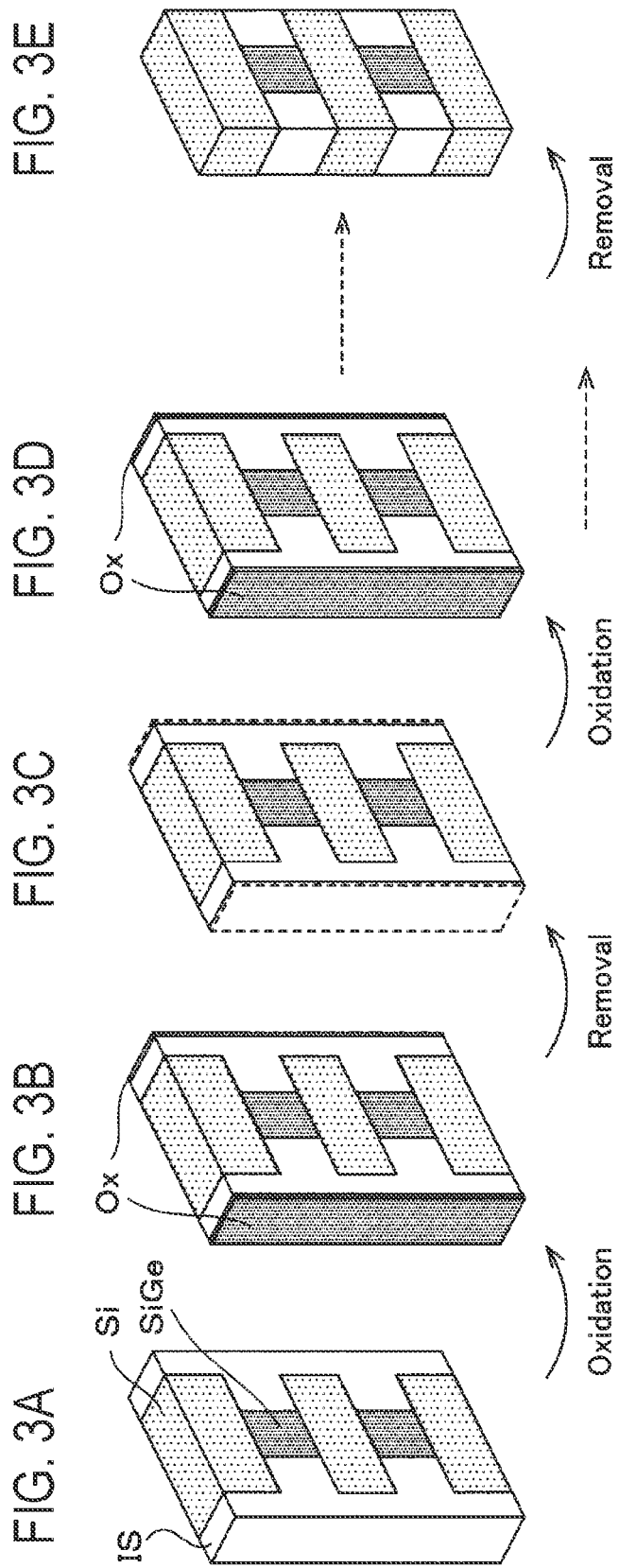

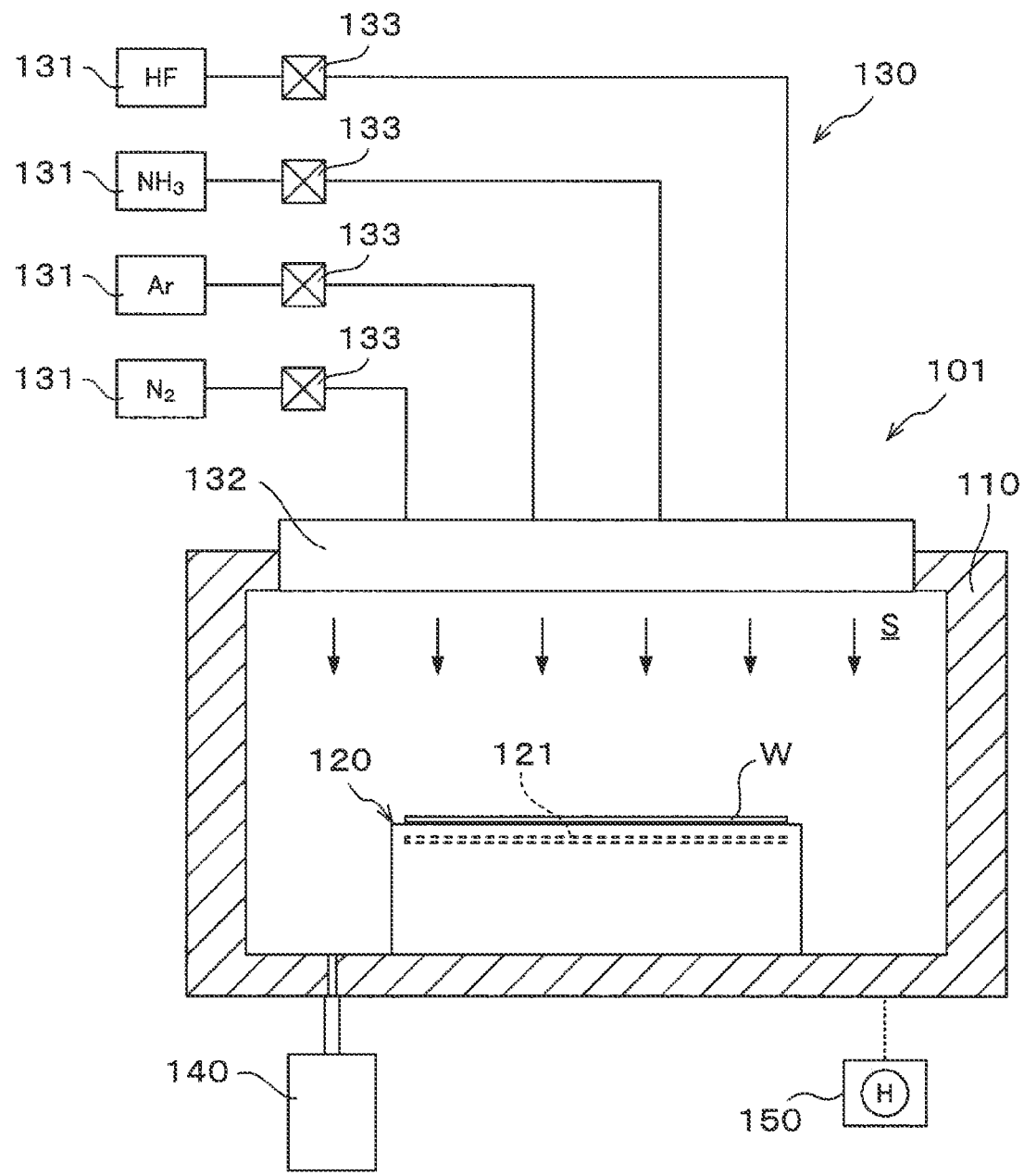

before cycle after 7 cycles

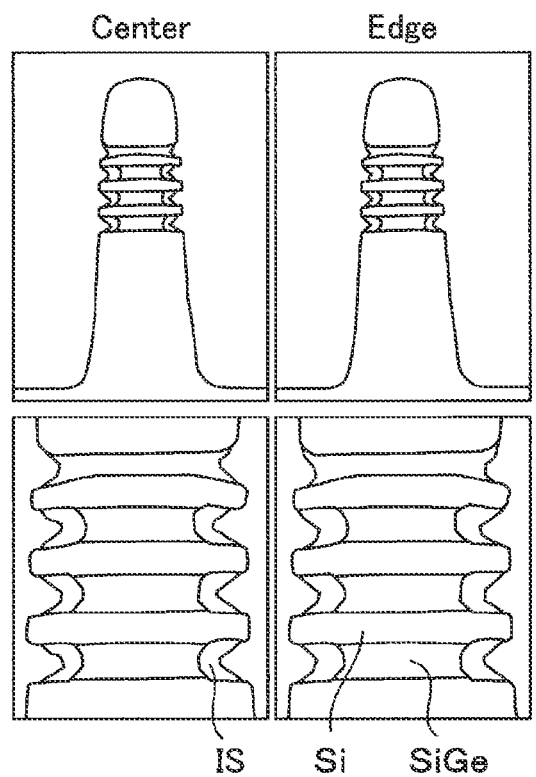

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2020-041347, filed on Mar. 10, 2020, the entire contents of which are incorporated herein by reference.

TECHNICAL FIELD

The present disclosure relates to a substrate processing method and a substrate processing apparatus.

BACKGROUND

Patent Document 1 discloses a method of manufacturing a semiconductor device in which a SiN layer formed to cover a transistor on a surface of a substrate is etched using a gas containing a halogen element. According to the method described in Patent Document 1, at an initial stage of supplying the gas containing the halogen element, a gas containing a basic gas is mixed and supplied. As a result, a SiNO layer formed to cover a surface of the SiN layer is changed to a layer of a reaction product, and accordingly, the SiN layer is etched by the gas containing the halogen element.

PRIOR ART DOCUMENT

Patent Document

Patent Document 1: International Publication No. WO 2012/063901

SUMMARY

According to one embodiment of the present disclosure, a method for processing a substrate on which silicon layers and silicon germanium layers are alternately disposed, includes: forming an oxide layer on a surface layer of a spacer layer based on an oxygen-containing gas radicalized using remote plasma, wherein the spacer layer having a low dielectric constant is formed at least on side surfaces of the silicon layers and the silicon germanium layers; and removing the formed oxide layer by etching.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a flowchart illustrating main processes of a wafer processing according to a present embodiment.

FIGS. 3A to 3E are schematic diagrams illustrating states of the wafer processing according to the present embodiment.

FIG. 6 is a vertical cross-sectional view illustrating an example of a configuration of an etching processing apparatus.

FIGS. 7A to 7C are schematic diagrams illustrating examples of results of the wafer processing according to the present embodiment.

DETAILED DESCRIPTION

Figure 1A:
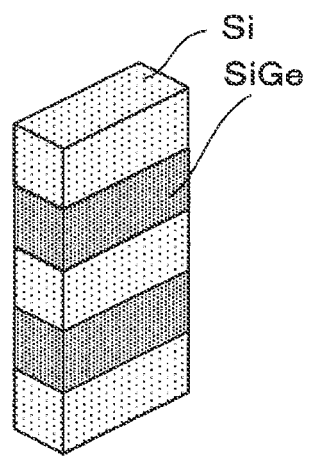
FIGS. 1A to 1D are schematic diagrams for illustrating states of a conventional wafer processing.
Figure 1B:
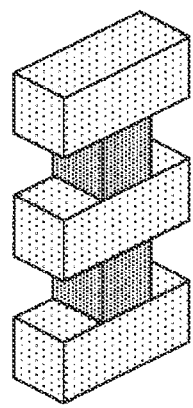
Figure 1C:
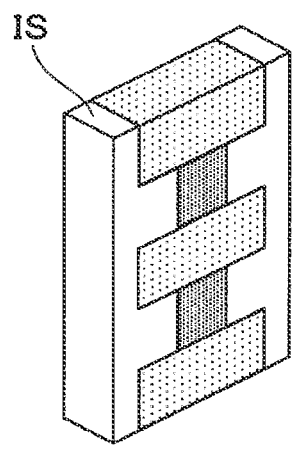
Figure 1D:
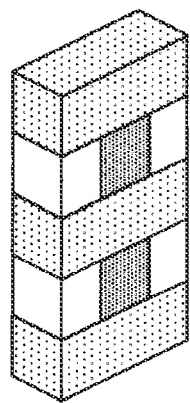

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In semiconductor devices, a layer containing silicon is applied in a wide variety of uses. For example, a silicon germanium (SiGe) layer or a silicon (Si) layer is used as a gate electrode material, a channel material, or the like. Conventionally, in the process of manufacturing a gate-all-around (GAA) transistor, such as a nanosheet or a nanowire, as illustrated in FIGS. 1A to 1D, (a) lamination of SiGe layers and Si layers on a substrate (a wafer W), and (b) selective etching of the SiGe layers, (c) embedding of a spacer layer (IS) (Inner Spacer) as an insulating layer, and (d) etching of the excess spacer layer IS are performed in sequence. Further, the insulating layer embedded in (c) is provided as an insulating layer for reducing a parasitic capacitance between a metal gate, and a source and a drain to be embedded in subsequent processes. In addition, the etching of the spacer layer IS in (d) is performed such that at least side surfaces of the stacked Si layers are exposed. In subsequent processes, for example, a crystalline silicon thin film is epitaxially grown on the side surfaces of the exposed Si layers (hereinafter, referred to as "exposed side surfaces").

The above-described technique disclosed in Patent Document 1 is a method for (d) etching an extra spacer layer IS. Specifically, a silicon nitride (SiN) layer (spacer layer IS) formed to cover a transistor is etched using a gas containing a halogen element to form the SiN layer to a desired thickness.

In recent years, as material candidates for the spacer layer IS of the next generation transistor having a nanosheet structure, materials having a lower dielectric constant than that of a conventional SiN layer, for example, a carbon-containing silicon oxide layer (SiOC layer), a silicon oxide nitride layer (SiON layer), a silicon oxide carbon nitride layer (SiOCN layer), and a silicon boron carbon nitride layer (SiBCN layer) have attracted attention. However, these SiOC, SiON, SiOCN, and SiBCN layers have stable chemical properties, and thus, a desired etching amount cannot be obtained through a conventional etching method (e.g., wet etching or dry etching). That is, when these materials are used as a spacer layer IS, etching the spacer layer IS in the above-mentioned (d) cannot be properly performed, and thus, it is difficult to perform isotropic etching without damaging a channel.

The technique according to the present disclosure has been made in view of the above circumstances, and appropriately removes, in particular, a spacer layer having a low dielectric constant, such as a SiOC layer, when processing a substrate in which silicon layers and silicon germanium layers are alternately stacked. Hereinafter, the wafer processing as a substrate processing method according to this embodiment will be described with reference to the drawings. Further, in this specification and the accompanying drawings, elements having substantially the same functional configurations will be denoted by the same reference numerals and redundant explanations will be omitted.

FIG. 2 is a flowchart illustrating main processes of removing a spacer layer IS (e.g., a SiOC layer in the following description) as the wafer processing method according to this embodiment. Further, FIGS. 3A to 3E are diagrams for illustrating the main processes for removing a spacer layer IS.

As illustrated in FIG. 2 and FIGS. 3A to 3E, when removing a spacer layer IS according to this embodiment, a process of forming an oxide layer Ox on a surface layer of the spacer layer IS to cover at least side surfaces of Si layers and SiGe layers disposed on a wafer W (Step T1 in FIG. 2), and a process of etching and removing the formed oxide layer Ox (Step T2 in FIG. 2) are performed. These Steps T1 and T2 are repeatedly performed until at least the side surfaces of the Si layers are exposed by etching removal of the spacer layer IS and the exposed side surfaces are formed as illustrated in FIG. 3E (branch C1 in FIG. 2).

Hereinafter, a detailed method of each of the processes illustrated in FIG. 2 and FIGS. 3A to 3E is described.

<Step T1: Forming an Oxide Layer on a Spacer Layer>

Figure 4:
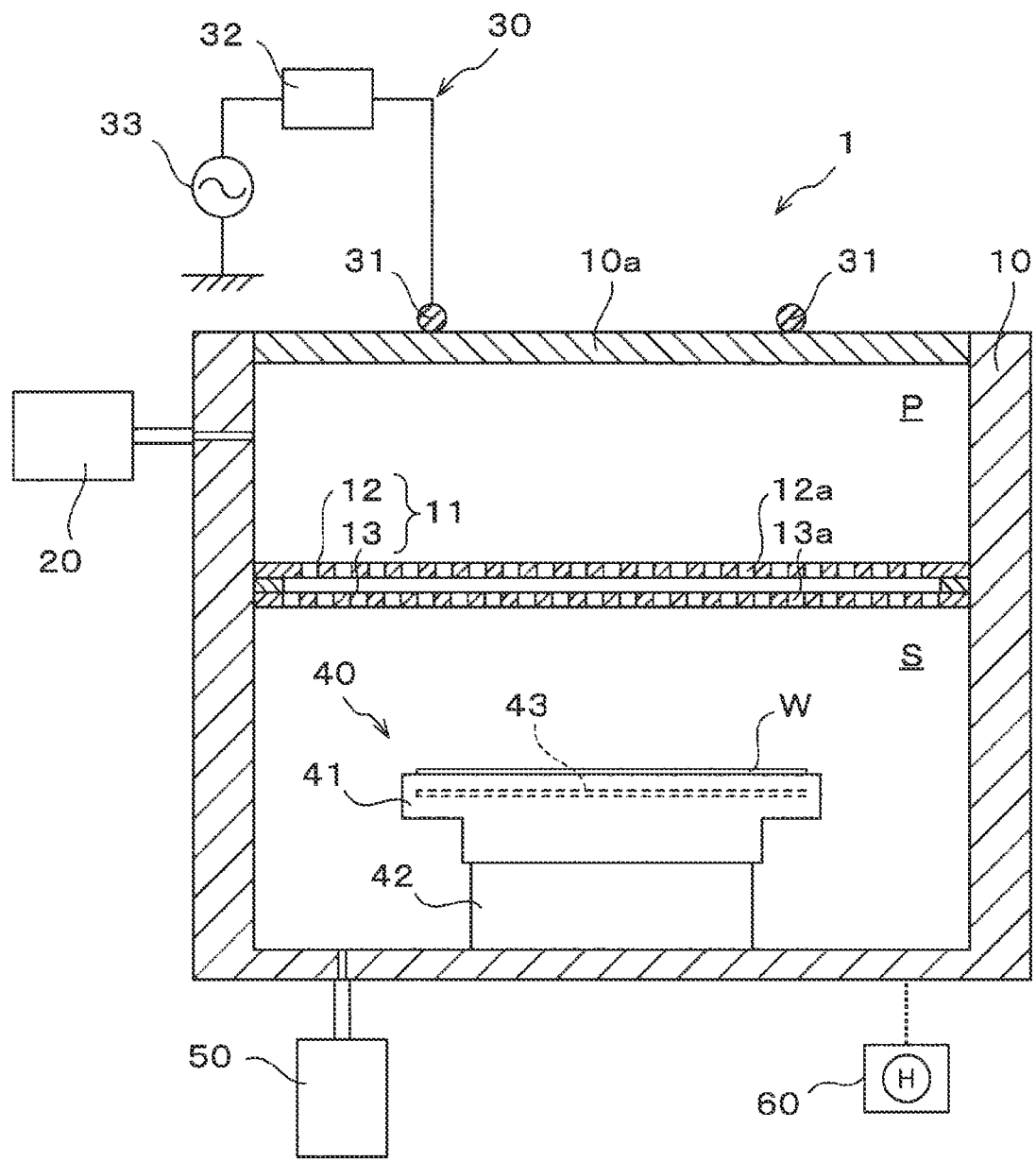
FIG. 4 is a vertical cross-sectional view illustrating an example of a configuration of a plasma processing apparatus.

In the Step T1 of FIG. 2, the spacer layer IS is oxidized using a plasma processing apparatus 1 as a plasma processing device, to form an oxide layer Ox on a surface layer of the spacer layer IS, that is, from the surface and towards the depth direction. FIG. 4 is a vertical cross-sectional view schematically illustrating a configuration of the plasma processing apparatus 1 for performing the plasma oxidation process.

As illustrated in FIG. 4, the plasma processing apparatus 1 includes a processing container 10 having a sealed structure for accommodating a wafer W. The processing container 10 is made of, for example, aluminum or an aluminum alloy, and an upper end thereof is opened. The upper end of the processing container 10 is closed by a lid 10a serving as a ceiling. A carry-in and carry-out port (illustration omitted) of the wafer W is provided on a side surface of the processing container 10, and the processing container 10 is connected to the outside of the plasma processing apparatus 1 via the carry-in and carry-out port. The carry-in and carry-out port is configured to be opened or closed by a gate valve (illustration omitted).

The inside of the processing container 10 is partitioned by a partition plate 11 into an upper plasma generation space P and a lower processing space S. That is, the plasma processing apparatus 1 according to this embodiment is configured as a remote plasma processing apparatus in which the plasma generation space P is separated from the processing space S.

The partition plate 11 includes at least two plate-shaped members 12 and 13 arranged to overlap each other with a gap therebetween from the plasma generation space P toward the processing space S. Each of the plate-shaped members 12 and 13 has slits 12a or 13a formed by penetration in a direction of the overlap. Slits 12a and 13a are respectively arranged in a manner not to overlap each other in a plan view, and as a result, the partition plate 11 serves as a so-called ion trap that suppresses permeation of ions in the plasma into the processing space S when the plasma is generated in the plasma generation space P. More specifically, due to a labyrinth structure in which the slits 12a and the slits 13a are arranged in a manner not to overlap each other, movement of anisotropically moving ions is prevented from permeating therethrough, while isotropically moving radicals are allowed to permeate therethrough.

The plasma generation space P has a gas supply 20, which supplies a processing gas into the processing container 10 and a plasma generator 30, which plasmarizes the processing gas supplied into the processing container 10.

A plurality of gas supply sources (illustration omitted) are connected to the gas supply 20, and each of the gas supply sources supplies a processing gas which contains an oxygen-containing gas (e.g., $O_2$ gas) and a dilution gas (e.g., Ar gas), to the inside of the processing container 10. Further, the types of the oxygen-containing gas and dilution gas supplied to the gas supply 20 are not limited thereto, as long as the oxide layer Ox can be formed on the surface layer of the spacer layer IS.

In addition, the gas supply 20 is provided with a flow rate regulator (illustration omitted) configured to regulate an amount of the processing gas supplied to the plasma generation space P. The flow rate regulator has, for example, a valve for opening and closing and a mass flow controller.

The plasma generator 30 is configured as an inductively coupled apparatus which uses a radiofrequency (RF) antenna. The lid 10a of the processing container 10 is formed of, for example, a quartz plate and is provided as a dielectric window. RF antennas 31 configured to generate inductively coupled plasma in the plasma generation space P of the processing container 10 are provided above the lid 10a. The RF antennas 31 are connected, via a matcher 32 having a matching circuit for matching impedances on a power supply side and a load side, to a high-frequency power supply 33 configured to output a high-frequency power at a predetermined frequency (usually, 13.56 MHz or more) suitable for plasma generation at an arbitrary output value.

The processing space S includes a placement stage 40, on which the wafer W is placed in the processing container 10, and an exhaust device 50 configured to discharge the processing gas in the processing container 10.

The placement stage 40 includes an upper stage 41 on which he water W is placed and a lower stage 42 fixed to a bottom surface of the processing container 10 to support the upper stage 41. Inside the upper stage 41, a temperature adjustment mechanism 43 is provided so as to adjust a temperature of the wafer W.

The exhaust device 50 is connected to an exhaust mechanism (illustration omitted), such as a vacuum pump, via an exhaust pipe provided in a bottom portion of the processing container 10. Further, the exhaust pipe is provided with an automatic pressure control valve (APC). Pressure within the processing container 10 is controlled by the exhaust mechanism and the automatic pressure control valve.

The plasma processing apparatus 1 described above is provided with a control device 60 as a controller. The control device 60 is a computer including, for example, a CPU and memory, and includes a program storage (illustration omitted). In the program storage, a program for controlling processing of the wafer W in the plasma processing apparatus 1 is stored. The program storage also stores a program for controlling operations of drive systems of, for example, the above-mentioned various processing apparatus and transport apparatuses, so as to implement wafer processing, which is to be described later with respect to the plasma processing apparatus 1. Further, the program may be recorded in a computer-readable storage medium H, and may be installed in the control device 60 from the storage medium H.

The plasma processing apparatus 1 according to this embodiment is configured as described above. Next, the plasma oxidation process (formation of an oxide layer Ox) performed using the plasma processing apparatus 1 will be described. Further, the wafer W carried into the plasma processing apparatus 1 has the above-mentioned Si layers and SiGe layers alternately disposed in advance, and a spacer layer IS is formed at least on side surfaces of the Si layers and the SiGe layers.

First, the wafer W, on which Si layers, SiGe layers, and a spacer layer IS are formed as illustrated in FIG. 3A, is placed on a placement stage 40. On the wafer W carried into the plasma processing apparatus 1, an oxide layer Ox is formed on a surface layer of the spacer layer IS as illustrated in FIG. 3B, as a result of oxidation of the spacer layer IS formed on the side surfaces of the Si layers and the SiGe layers.

Specifically, when the wafer W is placed on the placement stage 40, the plasma generation space P is supplied with the oxygen-containing gas ($O_2$ gas) and the dilution gas (Ar gas) from the gas supply 20, and the high-frequency power is supplied to the RF antennas 31 to generate an oxygen-containing plasma, which is inductively coupled plasma. In other words, the generated plasma contains oxygen radicals (O*). At this time, the pressure in the processing space S is controlled to, for example, about 50 mTorr to 1,000 mTorr, and the temperature of the wafer W on the placement stage 40 is controlled to, for example, about 60 degrees C. to 150 degrees C. Further, the flow rates of the $O_2$ gas and the Ar gas supplied into the processing space S are controlled to, for example, about 100 sccm to 1,00 sccm and 10 sccm to 500 sccm, respectively.

The plasma generated in the plasma generation space P is supplied to the processing space S through the partition plate 11. Here, since the partition plate H has the labyrinth structure formed as described above, only the radicals generated in the plasma generation space P may permeate into the processing space S. Then, the radicals supplied to the processing space S are allowed to react with the surface of the spacer layer IS to oxidize the surface and to form the oxide layer Ox on the surface layer of the spacer layer IS. More specifically, for example, when the spacer layer IS is composed of a SiOC layer, the SiOC layer is charged (O is bonded in place of C) by a reaction of the oxygen radicals to form a $SiO_2$, layer as the oxide layer Ox.

Further, in this plasma oxidation process, since only the radicals that move isotropically as described above permeate into the processing space S, the oxide layer Ox is formed isotropically. More specifically, the oxide layer Ox is uniformly formed in a plane of the wafer W and in a height direction of the stacked Si layers and SiGe layers.

Figure 5:
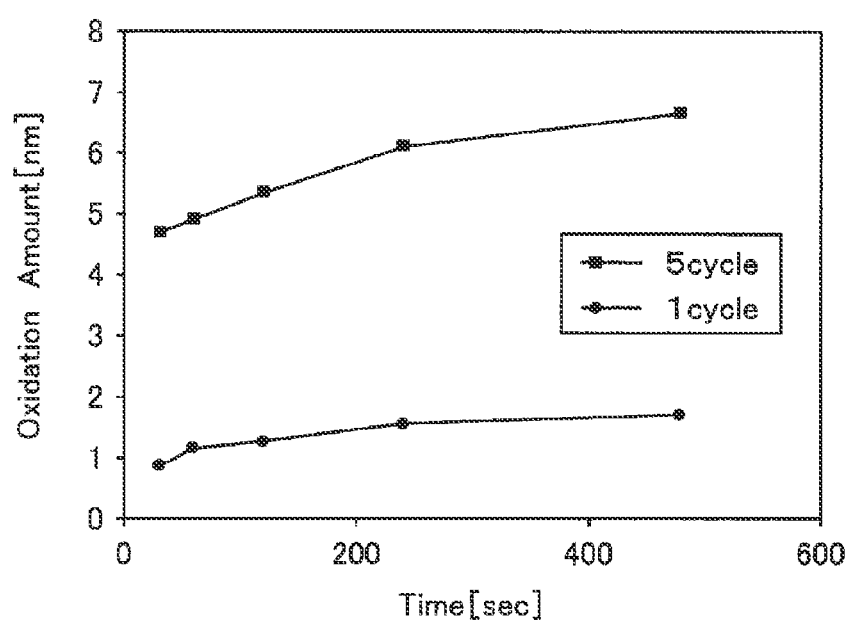
FIG. 5 is a graph showing a relationship between a plasma oxidation processing time and an amount of oxidation.

Here, the plasma oxidation process according to the present embodiment is a process in which an oxidation amount of the spacer layer IS, in other words, the thickness of the formed oxide layer Ox, is saturated during the processing time of the plasma oxidation process. Further, in this embodiment, the thickness of the oxide layer Ox formed through one plasma oxidation process is 2 nm or less (e.g., about 1 nm to 1.5 nm), as illustrated in FIG. 5.

<Step T2: Etching Removal of Oxide Layer Ox>

When the oxide layer Ox is formed on the surface layer of the spacer layer IS, the removal of the oxide layer Ox formed in the Step T1 by etching is performed using an etching processing apparatus 101 as the etching processing device. FIG. 6 is a vertical cross-sectional view schematically illustrating a configuration of the etching processing apparatus 101 for performing the removal process.

As illustrated in FIG. 6, the etching processing apparatus 101 includes a processing container 110 having a sealed structure for accommodating a wafer W, and a processing space S is formed inside the processing container 110. A carry-in and carry-out port (illustration omitted) of the wafer W is provided on a side surface of the processing container 110, and the processing container 110 is connected to the outside of the etching processing apparatus 101 via this carry-in and carry-out port. The carry-in and carry-out port is configured to be opened and closed by a gate valve (illustration omitted). Further, the etching processing apparatus 101 includes a placement stage 120 on which the wafer W is placed in the processing container 110, a supply device 130 configured to supply an etching gas into the processing space S, and an exhaust device 140 configured to discharge the etching gas in the processing container 110.

The placement stage 120 has a substantially circular shape in a plan view, and is fixed to a bottom portion of the processing container 110. Inside the placement stage 120, a temperature adjustment mechanism 121 configured to adjust a temperature of the placement stage 120 and the wafer W held on the placement stage 120, is provided.

The supply device 130 includes a plurality of gas supply sources 131, each of which is configured to supply one of a fluorine containing gas (e.g., HF gas), an ammonia ($NH_3$) gas, a dilution gas (e.g., Ar gas), and an inert gas (e.g., $N_2$ gas) as an etching gas inside the processing container 110, and also includes a shower head 132 provided on a ceiling of the processing container 110 and having a plurality of ejection ports for ejecting a processing gas into the processing space S. Each gas supply source 131 is connected to the inside of the processing container 110 via a supply pipe connected to the shower head 132.

Further, the supply device 130 is provided with a flow rate regulator 133 configured to regulate an amount of etching gas supplied to the inside of the processing container 110. The flow rate regulator 133 has, for example, a valve for opening and closing and a mass flow controller.

The exhaust device 140 is connected to an exhaust mechanism (illustration omitted), such as a vacuum pump, via an exhaust pipe provided in a bottom portion of the processing container 110. Further, the exhaust pipe is provided with an automatic pressure control valve (APC). Pressure within the processing container 110 is controlled by the exhaust mechanism and the automatic pressure control valve.

The etching processing apparatus 101 described above is provided with a control device 150 as a controller. The control device 150 is a computer including, for example, a CPU and memory, and includes a program storage (illustration omitted). In the program storage, a program for controlling the processing of the wafer W in the etching processing apparatus 101 is stored. The program storage also stores a program for controlling operations of drive systems of, for example, the above-mentioned various processing apparatus and transport apparatuses, so as to implement wafer processing to be described later in the etching processing apparatus 101. Further, the program may be recorded in a computer-readable storage medium H, and may be installed in the control device 150 from the storage medium H.

In addition, the control device 150 provided in the etching processing apparatus 101 may be the same as the control device 60 provided in the plasma processing apparatus 1.

That is, the etching processing apparatus 101 may be connected to the control device 60 provided in the plasma processing apparatus 1, instead of the control device 150.

The etching processing apparatus 101 according to the present embodiment is configured as described above. Next, an etching removal process (removal of an oxide layer Ox) performed using the etching processing apparatus 101 will be described. Further, the wafer W carried into the etching processing apparatus 101 has an oxide layer Ox formed in advance on the surface layer of the spacer layer IS in the above-described Step T1.

First, as illustrated in FIG. 3B, the water W having the oxide layer Ox formed on the surface layer of the spacer layer IS is placed on the placement stage 120. As illustrated in FIG. 3C, gas etching of the oxide layer Ox is performed on the wafer W carried into the etching processing apparatus 101 by causing the etching gas to react with the formed oxide layer Ox.

Specifically, when the wafer W is placed on the placement stage 120, a dilution gas (Ar gas) and an inert gas ($N_2$ gas) are supplied to the inside of the sealed processing container 110. At this time, the pressure in the processing container 110 is controlled to be lower than the atmospheric pressure (e.g., about 10 mTorr to 3,000 mTorr), and the temperature of the wafer W on the placement stage 120 is controlled to a desired temperature (e.g., 0 degrees C. to 120 degrees C., preferably 0 degrees C. to 60 degrees C.).

When the pressure within the processing container 110 and the temperature of the wafer W reach a desired low-pressure and low-temperature state, a fluorine-containing gas (HF gas) and $NH_3$ gas are further supplied to the inside of the processing container 110. At this time, the flow rates of HF gas, $NH_3$ gas, and Ar gas supplied into the processing space S are controlled to be, for example, about 10 sccm to 500 sccm, 10 sccm to 500 sccm, and 10 sccm to 500 sccm, respectively. Further, by supplying the HF gas and the NH3 gas to the inside of the processing container 110 in this way, the gas etching of the oxide layer Ox formed on the surface layer of the spacer layer IS is initiated.

Here, the SiOC layer used as the material of the spacer layer IS in the present embodiment is a material having chemically stable properties as described above, and the etching rate (ER) is very small when compared to that of the oxide layer Ox ($SiO_3$). That is, in the etching removal process according to the present embodiment, the etching removal does not proceed so much inside the spacer layer IS on which the oxide layer Ox is not formed in the Step T1, and the oxide layer Ox formed on the surface layer of the spacer layer IS is selectively etched and removed. In other words, since only the oxide layer Ox can he selectively etched and removed while leaving the spacer layer IS, it is possible to easily control the etching of the spacer layer IS.

In addition, as illustrated in FIG. 5, the thickness of the oxide layer Ox formed in one plasma oxidation process is saturated at, for example, about 1 nm to 1.5 nm. Further, as described above, in the plasma oxidation process according to the present embodiment using the oxygen radicals, the oxide layer Ox is formed isotropically. Then, in the etching removal process of the Step T2, the spacer layer IS is etched by removing the oxide layer Ox which is formed isotropically with a thickness of about 1 nm to 1.5 nm. Thus, it is possible to perform the etching removal of the spacer layer IS isotropically.

In addition, in the present embodiment, the etching removal process of the Step T2 is performed under the low-pressure and low-temperature condition. Here, in a case where the etching removal process is performed under a high-temperature and high-pressure condition, the EA of the spacer layer IS rises, and the selective etching removal of the oxide layer Ox is not properly performed. Thus, there is a concern that the spacer layer IS may not be formed in a desired shape. In this regard, since the etching removal process in this embodiment is performed under the low-pressure and low-temperature condition, for example, under the condition where the temperature of the wafer W is 0 degrees C. to 120 degrees C., preferably 0 degrees C. to 60 degrees C., the selective etching removal of the oxide layer Ox can be properly performed.

<Branch C1: Repetition of Plasma Oxidation Process and Etching Removal Process>

The plasma oxidation process (Step T1) and the etching removal process (Step T2) according to the present embodiment are performed as described above. As mentioned above, in a series of wafer processing processes (a plasma oxidation process and an etching removal process) according to this embodiment, only the oxide layer Ox (the spacer layer IS) having a thickness of about 1 nm to 1.5 nm is removed. That is, the side surfaces of the Si layer cannot be exposed by performing the wafer processing only one time. Therefore, in the present embodiment, the total etching amount (oxidation amount) is increased as shown in FIG. 5 by repeating a cycle of this series of wafer processing processes (Step T1 and Step T2). As a result, it is possible to remove the spacer layer IS to a desired thickness by etching, specifically, to a thickness at which at least side surfaces of the Si layers are exposed so that exposed side surfaces are formed.

In other words, the number of repeated wafer processing cycles in the present embodiment is determined depending on the thickness of the spacer layer IS formed to cover the Si layers and the SiGe layers.

In case the wafer processing cycle is repeatedly performed, the oxide layer Ox having a thickness of 2 nm or less is isotropically formed in one plasma oxidation process, and the oxide layer Ox formed in this way is selectively removed in one removal etching process. That is, the thickness of the spacer layer IS removed by performing etching removal at one time may be controlled to be a constant and it is easy to control the in-plane uniformity of the etching amount of the spacer layer IS.

Then, when a desired etching amount is obtained by repeating the wafer processing cycle in this way, that is, when the exposed side surfaces are formed on the Si layers, the wafer processing according to this embodiment is ended.

Further, the wafer W on which the exposed side surfaces of the Si layers are formed is transported to the next process, and for example, a crystalline silicon thin layer is epitaxially grown on the exposed side surfaces. At this time, as illustrated. in FIG. 3E, the spacer layer IS remains on the side surfaces of the SiGe layers, and thus the epitaxial growth of the crystalline silicon thin layer on the side surfaces of the SiGe layers is suppressed.

<Effect of Wafer Processing According to the Present Embodiment>

According to the present embodiment, it is possible to appropriately form an oxide layer Ox ($SiO_2$ layer) by oxidizing a surface layer of a spacer layer IS (e.g., an SiOC layer, an SiON layer, or an SiOCN layer) formed of a chemically stable material having a lower dielectric constant than that of the conventional SiN layer, by using an oxygen-containing gas which has been plasmarized using remote plasma. Then, it is possible to appropriately remove by etching the formed oxide layer Ox using the fluorine-containing gas (e.g., HF gas) and ammonia ($NH_3$) gas. That is, according to the present embodiment, it is possible to suitably remove the spacer layer IS serving as an insulating layer.

In addition, according to the wafer processing in accordance with the present embodiment, the spacer layer IS itself having chemically stable properties as described above is not subject to etching removal, and it is possible to selectively remove by etching only the oxide layer Ox formed as described above. That is, it is possible to appropriately control the etching of the spacer layer IS, and to suppress any damage caused by etching a portion other than the oxide layer Ox which is an etching object. Further, at this time, since the oxide layer Ox is formed isotropically on the surface layer of the spacer layer IS, the spacer layer IS is isotropically removed by etching.

In addition, according to the present embodiment, only the spacer layer IS having a size of 2 nm or less (e.g., about 1 nm to 1.5 nm) is etched and removed by one cycle of the wafer processing, and a desired etching amount is obtained by repeatedly performing the wafer processing. At this time, the thickness of the spacer layer IS etched and removed, in other words, the thickness of the oxide layer Ox formed, is saturated within a plasma oxidation process time as shown in FIG. 5. That is, since it is possible to easily control the thickness of the spacer layer IS removed at one time, it is possible to appropriately control the total etching amount of the spacer layer IS in wafer processing. That is, exceeding the desired total etching amount is appropriately suppressed.

Figure 7A:
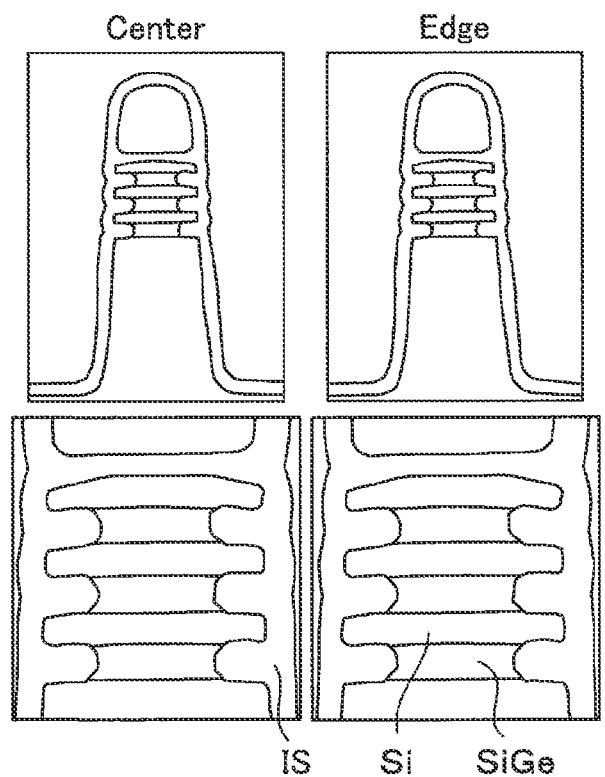
Figure 7B:
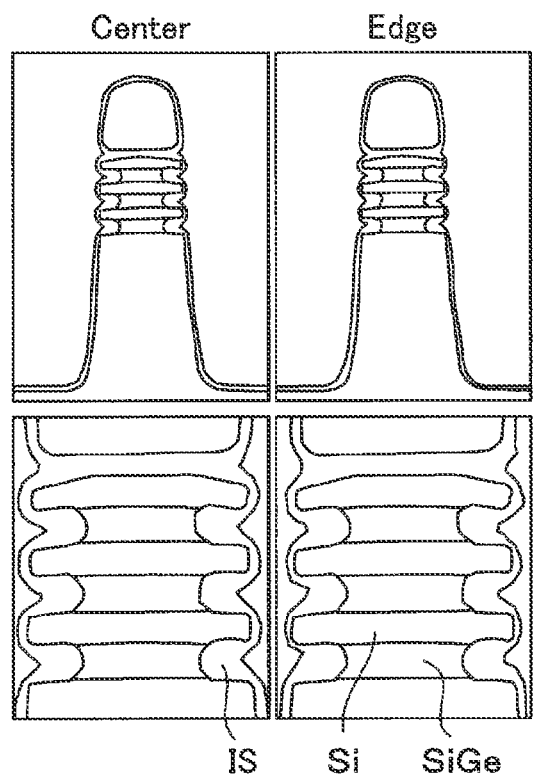

Here, FIGS. 7A to 7C illustrate examples of processing results in a case where the wafer-processing cycle according to the present embodiment is repeatedly performed. FIG. 7A illustrates a state of a spacer layer IS before the wafer processing, FIG. 7B illustrates a state of the spacer layer IS after 7 cycles of the wafer processing, and FIG. 7C shows a state of the spacer layer IS after 10 cycles of the wafer processing. Further, the bottom views in FIGS. 7A to 7C are enlarged views of main portions (a Si layer, a SiGe layer, and a spacer layer IS) of the top views.

By performing 7 cycles of wafer processing, the thickness of the spacer layer IS, which was formed on the side surfaces of the Si layers and the SiGe layers as illustrated in FIG. 7A, was reduced, that is, etched and removed, as illustrated in FIG. 7B. Then, by further repeating the processing cycles and thus performing 10 cycles of the wafer processing, exposed side surfaces on the Si layers were formed, as illustrated in FIG. 7C. At this time, the spacer layer IS remains on the side surfaces of the SiGe layers.

Further, as illustrated in FIGS. 7B and 7C, the thickness of the spacer layer IS remaining on the side surfaces of the Si layers and the SiGe layers is uniform in the plane of the wafer W, and is also uniform in the height direction of the stacked Si layers and SiGe layers. In other words, in the wafer processing according to this embodiment, it is evident that the etching removal of the spacer layer IS proceeds uniformly in the plane direction and the height direction of the wafer W.

As described above, according to the plasma oxidation process and the etching removal process in accordance with the present embodiment, the etching removal of the spacer layer IS, which serves as an insulating layer, can be performed isotropically. Further, as illustrated in FIGS. 7B and 7C, it is possible to easily control the total etching amount of the spacer layer IS by controlling the number of repeated cycles of the wafer processing, and thus, etching removal in excess of a desired etching amount can be suppressed.

In addition, the plasma oxidation process and the etching removal process according to the present embodiment may be performed in different chambers, or may be performed in the same chamber.

Further, in the above-described embodiment, the oxide layer Ox is selectively removed using a difference in an etching rate between the oxide layer Ox and the spacer layer IS, and the etching removal process of the spacer layer IS is performed accordingly. However, the etching method of the spacer layer IS is not limited thereto.

Specifically, for example, the etching removal process of the spacer layer IS may be performed by selectively removing the oxide layer Ox using a difference in an incubation time (the time until etching removal is started) between the oxide layer Ox and the spacer layer IS. In such a case, in the etching removal process, the removal of the oxide layer Ox is started in the etching processing apparatus 101, and the etching gas is discharged from the inside of the processing container 110 before the removal of the spacer layer IS is started. Accordingly, it is possible to selectively remove only the oxide layer Ox.

Further, when the difference in the etching rate between the oxide layer Ox and the spacer layer IS is used as described above, the etching removal process using the etching removal apparatus is performed under a low-pressure and low-temperature condition. This is because the etching rate of the spacer layer IS decreases under the low-temperature and low-pressure condition so that the oxide layer Ox can be more appropriately removed. On the other hand, when the difference in the incubation time is used in this way, the etching removal process may be performed under a high-temperature and high-pressure condition (e.g., a temperature condition of 80 to 130 degrees C.). That is, the difference in the incubation time between the oxide layer Ox and the spacer layer IS becomes more remarkable under the high-temperature and high-pressure condition.

Here, when the etching removal process is performed under the low-pressure and low-temperature condition using the difference in etching rate, the plasma oxidation process using the plasma processing apparatus 1 is performed at a temperature higher than temperature condition of the etching removal process, for example, 60 degrees C. to 150 degrees C., as described above. That is, it is necessary to cool down the wafer W when shifting from the plasma oxidation process to the etching removal process. On the other hand, when the etching removal process is performed under the high-temperature and high-pressure condition using the difference in the incubation time, the temperature condition of the etching removal process is almost the same as the temperature condition of the plasma oxidation process. That is, since it is not necessary to control the temperature of the wafer W when shifting from the plasma oxidation process to the etching removal process, it is possible to efficiently perform a series of wafer processing processes.

It should be understood that the embodiments disclosed herein are illustrative and are not limiting in all aspects. The above-described embodiments may be omitted, replaced, or modified in various forms without departing from the scope and spirit of the appended claims.

The following configurations also belong to the technical scope of the present disclosure.

(1) A method for processing a substrate on which silicon layers and silicon germanium layers are alternately disposed, including: forming an oxide layer on a surface layer of a spacer layer based on an oxygen-containing gas radicalized using remote plasma, wherein the spacer layer having a low dielectric constant is formed at least on side surfaces of the silicon layers and the silicon germanium layers; and removing the formed oxide layer by etching.

According to the method in (1) above, it is possible to remove a spacer layer by forming an oxide layer on the surface layer of the spacer layer having a low dielectric constant using a plasmarized oxygen-containing gas, and further removing by etching the formed oxide layer. Since the spacer layer having the low dielectric constant has chemically stable properties, it was difficult to perform etching removal in the conventional etching method. However, since it is possible to appropriately form an oxide layer using the plasmarized oxygen-containing gas as described above, it is possible to appropriately remove the spacer layer with the formed oxide layer.

Further, since the oxidation of the spacer layer using the plasmarized oxygen-containing gas proceeds isotropically in the plane direction and the height direction of the substrate, it is possible to perform etching removal of the spacer layer isotropically in the plane direction and the height direction of the wafer W.

(2) The substrate processing method in (1) above, wherein the spacer layer is formed by any one of SiOC, SiON, SiOCN, and SiBCN.

(3) The substrate processing method in (1) or (2) above, wherein the formed oxide layer has a thickness of 2 nm or less from a surface of the spacer layer.

(4) The substrate processing method in any of (1) to (3) above, wherein a thickness of the formed oxide layer is controlled by a processing time of forming the oxide layer.

(5) The substrate processing method in any of (1) to (4) above, wherein removing the oxide layer by etching is performed by etching based on a processing gas, which contains at least a HF gas and a $NH_3$ gas.

(6) The substrate processing method in (5) above, removing the oxide layer by etching is performed under a low-temperature and low-pressure condition, and a temperature condition under which a corresponding etch removal is performed, is 0 degrees C. to 120 degrees C., preferably from 0 degrees C. to 60 degrees C.

(7) The substrate processing method in any of (1) to (6) above, further including repetitively performing a cycle, which includes forming the oxide layer and removing the oxide layer by etching to remove the spacer layer, thereby exposing at least the side surfaces of the silicon layers.

According to the method in (7) above, it is possible to obtain a desired amount of etching by repeatedly removing the spacer layer. In particular, as described in the method in (3) above, since the amount of oxidation of the spacer layer (the amount of etching of the spacer layer) when performing wafer processing one time is saturated at 2 nm or less, it is possible to easily control the total amount of etching of the spacer layer. Further, since the amount of oxidation (the amount of etching) of the spacer layer is as small as 2 nm or less, it is possible to further easily control the total amount of etching of the spacer layer.

(8) An apparatus for processing a substrate in which silicon layers and silicon germanium layers are alternately disposed, wherein a spacer layer having a low dielectric constant is formed at least on side surfaces of the silicon layers and the silicon germanium layers, the apparatus including: a plasma processing device configured to form an oxide layer on a surface layer of the spacer layer based on an oxygen-containing gas radicalized using remote plasma; an etching processing device configured to remove the formed oxide layer by etching; and a controller configured to control operations of the plasma processing device and the etching processing device.

(9) The substrate processing apparatus in (8) above, wherein the spacer layer is formed by any one of SiOC, SiON, SiOCN, and SiBCN.

(10) The substrate processing apparatus in (8) or (9) above, wherein the controller is configured to control the operation of the plasma processing device such that the formed oxide layer has a thickness of 2 nm or less from a surface of the spacer layer.

(11) The substrate processing apparatus in any of (8) to (10) above, wherein the controller is configured to control a thickness of the formed oxide layer by a processing time of the plasma processing device.

(12) The substrate processing apparatus in any of (8) to (11) above, wherein the controller is configured to control an operation of the etching processing device such that removing the oxide layer by etching is performed by etching based on a processing gas, which contains at least a HF gas and a $NH_3$ gas.

(13) The substrate processing apparatus in (12) above, wherein the controller is configured to control the operation of the etching processing device such that removing the oxide layer by etching is performed under a low-temperature and low-pressure condition, and a temperature condition under which a corresponding etching removal is performed is 0 degrees C. to 120 degrees C., preferably from 0 degrees C. to 60 degrees C.

(14) The substrate processing apparatus in any of (8) to (13) above, wherein the controller is configured to control operations of the plasma processing device and the etching processing device to repetitively perform a cycle, which includes forming the oxide layer and removing the oxide layer by etching to remove the spacer layer, thereby exposing at least the side surfaces of the silicon layers.

According to the present disclosure, in processing a substrate in which silicon layers and silicon germanium layers are alternately disposed, a spacer layer serving as an insulating layer is appropriately removed.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for processing a substrate on which silicon layers and silicon germanium layers are alternately disposed, comprising:
   forming an oxide layer on a surface layer of a spacer layer based on an oxygen-containing gas radicalized using remote plasma, wherein the spacer layer having a low dielectric constant is formed at least on side surfaces of the silicon layers and the silicon germanium layers; and
   removing the formed oxide layer by etching.

2. The method of claim 1, wherein the spacer layer is formed by any one of SiOC, SiON, SiOCN, and SiBCN.

3. The method of claim 2, wherein the formed oxide layer has a thickness of 2 nm or less from a surface of the spacer layer.

4. The method of claim 3, wherein the thickness of the formed oxide layer is controlled by a processing time of forming the oxide layer.

5. The method of claim 4, wherein removing the oxide layer by etching is performed by etching based on a processing gas, which contains at least a HF gas and a $NH_3$ gas.

6. The method of claim 5, wherein:
removing the oxide layer by etching is performed under a low-temperature and low-pressure condition, and
a temperature condition under which a corresponding etch removal is performed is 0 degrees C. to 120 degrees C.

7. The method of claim 1, wherein the formed oxide layer has a thickness of 2 nm or less from a surface of the spacer layer.

8. The method of claim 1, wherein a thickness of the formed oxide layer is controlled by a processing time of forming the oxide layer.

9. The method of claim 1, wherein removing the oxide layer by etching is performed by etching based on a processing gas, which contains at least a HF gas and a $NH_3$ gas.

10. The method of claim 1, further comprising: repetitively performing a cycle, which includes forming the oxide layer and removing the oxide layer by etching to remove the spacer layer, thereby exposing at least the side surfaces of the silicon layers.

* * * * *